United States Patent [19]

Sparks et al.

[11] Patent Number: 5,144,441
[45] Date of Patent: Sep. 1, 1992

[54] QUIETING RECEIVER DURING POWER INTERRUPTION

[75] Inventors: Bradley A. Sparks; Robert E. Morris, both of Indianapolis, Ind.

[73] Assignee: Thomson Consumer Electronics, Inc., Indianapolis, Ind.

[21] Appl. No.: 327,880

[22] Filed: Mar. 23, 1989

[51] Int. Cl.$^5$ .............................................. H04N 5/63
[52] U.S. Cl. ...................................... 358/190; 455/343
[58] Field of Search ............ 358/190, 189, 198, 191.1; 455/343, 185, 186

[56] References Cited

U.S. PATENT DOCUMENTS

| 3,882,400 | 5/1975 | Hamada | 325/456 |
|---|---|---|---|
| 4,031,549 | 6/1977 | Rast et al. | 358/193 |
| 4,110,693 | 8/1978 | Evans | 325/459 |
| 4,207,530 | 6/1980 | Gallagher | 455/174 |
| 4,227,257 | 10/1980 | Sato | 455/343 |
| 4,355,422 | 10/1982 | Paschen | 455/343 |
| 4,405,947 | 9/1983 | Tults et al. | 358/193.1 |
| 4,532,457 | 7/1985 | Haferl | 358/190 |
| 4,546,388 | 10/1985 | Williams, Jr. | 358/190 |
| 4,641,064 | 3/1987 | Testin et al. | 315/411 |
| 4,641,190 | 3/1987 | Testin et al. | 358/165 |
| 4,656,399 | 4/1987 | Testin et al. | 315/411 |
| 4,716,463 | 12/1987 | Stacy et al. | 358/190 |
| 4,743,864 | 5/1988 | Nakagawa et al. | 455/343 |
| 4,750,040 | 6/1988 | Hakamada | 358/190 |
| 4,763,195 | 8/1988 | Tults | 358/193.1 |

FOREIGN PATENT DOCUMENTS 0183334 6/1986 European Pat. Off. .
49-131336 12/1974 Japan .
1417794 12/1975 United Kingdom .

OTHER PUBLICATIONS

CTC 140 Color TV Chassis Technical Training Manual, first published by GE Consumer Electronics, pp. 34–39, 1987.
SL-HF750 Operation Manual, published by Sony, Aug., 1986, pp. 127–131.

Primary Examiner—Tommy P. Chin
Attorney, Agent, or Firm—Joseph S. Tripoli; Joseph J. Laks; Harvey D. Fried

[57] ABSTRACT

A receiver comprises a tuner circuit for detecting a selected input signal and an audio circuit for reproducing the audio content in the detected signal. The tuner circuit includes a local oscillator, a prescaler, a phase detector and an integrator, and has a tendency to uncontrollably detune during AC power interruption responsive to a spurious tuning control signal generated in the tuner circuit and generate audible noise during the detuning. The audible noise is introduced into the audio content of the detected signal. An AC power interruption detector monitors a run power supply and generates a power loss control signal when the run supply falls below a predetermined threshold. A control circuit responsive to the power loss control signal, absent a user command, first disables normal operation of the tuner circuit and then disables the audio circuit, thereby reducing the audible noise. The tuner circuit may be disabled by decoupling the output of the phase detector from the input to the integrator, enabling the input to float. In the absence of a corrective signal from the phase detector, which may be the spurious tuning control signal, the integrator maintains a substantially constant output tuning voltage and prevents sudden detuning.

25 Claims, 3 Drawing Sheets

QUIETING RECEIVER DURING POWER INTERRUPTION

This invention relates generally to the field of division and radio receivers, and in particular, to techniques for quieting television and radio receivers to prevent random noise generation during interruption of AC power.

Many television and radio receivers, including those found in video recording apparatus, are provided with digital tuning and control circuits. Many of these receivers provide for storing program information and preset tuning selections, and many are provided with remote control. Some provision must be made for maintaining such information in memory during periods when the receiver is turned off and for energizing the power on remote control circuit. Most receivers are therefore provided with standby power supplies, which continue to be energized by an AC power source even when the receiver has been turned off. Standby power supplies are intended to provide just enough power to maintain the power on circuit and the stored information, for example the information contained in the random access memory of a microprocessor based system control.

Such receivers may be provided with synthesizing tuning circuits for receiving user selected broadcast and cablecast signal transmissions. Synthesizing tuning circuits are disclosed in detail in U.S. Pat. No. 3,882,400, which also discloses muting during channel change, and U.S. Pat. No. 4,763,195, which also discloses autoprogramming.

Synthesizing tuners are frequently embodied as varactor tuning systems. A typical varactor tuning system has three stages that must be tuned. These are the radio frequency RF stage, the mixer stage and the voltage controlled local oscillator stage. Tuning is accomplished by varying tuning and band switching voltages. The tuning and band switching voltages are supplied from a tuner control circuit. Most tuning systems utilize integrated circuits.

A typical tuning system is a frequency synthesis type having a crystal controlled phase locked loop. Phase pulses are produced by comparing a sample of the tuner local oscillator signal to an internal reference frequency. The number of pulses, or sometimes the width of the pulses, is proportional to how far the local oscillator signal is off frequency. The phase pulses may be applied to an integrator, for example, to develop a tuning voltage for controlling the frequency of the local oscillator. Varying the number or width, and polarity of phase pulses adjusts the tuning.

As part of the tuner control circuit, a sample of the tuner local oscillator signal is supplied to a tuner prescaler. The prescaler is a divider that generates a divided down local oscillator signal. Dividing down the local oscillator signal produces a low frequency sample and permits the use of a low frequency reference, or comparison signal with the reference signal in the phase locked loop.

There are effectively two loops in the tuning system. The first is the phase locked loop which locks the frequency of the local oscillator signal to the crystal derived reference signal. Once the phase locked loop is "locked", AFT and sync are checked and used in the second loop to fine tune the local oscillator by changing the value of N in the divide by N circuit. The second loop is necessary due to frequency offsets of the RF carrier produced by cable systems, video recorders, video games, computers and the like.

Typically, the microprocessor is powered by a standby power supply, and is therefore always turned on when the receiver is plugged into an active AC power outlet. An analog interface unit, for developing analog control signals responsive to digital control signals generated by the microprocessor, receives a switched standby voltage. The source of power for the analog interface unit is also the standby power supply, but the analog interface unit may be switched off to reduce power drain when the receiver loses AC power. Other portions of the tuner control circuit, for example the prescaler, are powered by a run power supply circuit. One version of such a tuning system is described in the CTC140 Color TV Chasis Technical Training Manual, first published by GE Consumer Electronics, at pages 34-39.

In many such synthesizing tuning systems, audible noise may be generated and propagated through the audio amplification system whenever a channel is changed. This sound of static, which is sometimes referred to as a crashing or popping sound, is generally not harmful, but is considered to be very undesirable and unpleasant. Accordingly, the microprocessor which controls channel selection and tuning is frequently programmed to mute or turn the sound off prior to a channel change in order to prevent the propagation of such audible noise. The video signal may also be blanked. After a new station has been tuned in, the sound and picture are restored.

However, there are certain operating conditions of such receivers having synthesizing tuning which result in undesirable noise which is not eliminated by muting during channel changes. A cause precipitating these operating conditions is the unexpected interruption or loss of AC power, for example when the receiver is unplugged or when a reduced power condition occurs. This prevents the microprocessor from running those programs which would otherwise be utilized to turn off the receiver quietly responsive to a user control. The problem of unplugging the receiver becomes more widespread as more receivers become plugged into cable control boxes rather than directly into AC outlets. Turning off the cable control box then becomes equivalent to unplugging the receiver.

Tuning circuits as described herein have been the source of several problems during their introduction and more widespread use, and solutions to these problems are of some interest. A phase locked loop tuning system for a television receiver is described in U.S. Pat. No. 4,110,693 and includes a frequency divider for prescaling the frequency of a local oscillator signal generated by a control oscillator. A lockup condition sometimes results from an uncontrolled and erroneously high self oscillation of the prescaler. A lockup inhibiting arrangement is provided for causing the controlled oscillator to temporarily oscillate at a frequency for which the amplitude of the local oscillator signal is sufficiently high to overcome any self-oscillation of the prescaler before phase locked loop control is enabled, whenever the receiver is initially turned on or when a channel in a new band is selected.

Some of the first synthesizing tuning circuits were not precise enough for fine tuning, and some were a source of noise even during normal operation. Accordingly, such synthesizing tuning systems were used only for coarse tuning and thereafter disabled. An analog automatic fine tuning circuit was then utilized to maintain the channel selection.

More recently, a dual search mode tuning system was described in U.S. Pat. No. 4,405,947. In order to effect autoprogramming, even for stations cablecasting signals without picture synchronization components, tuning alternates between two sources switchably coupled to the input of an integrator generating tuning voltage as an output. One source is the phase locked loop, including the prescaler. The other source is the automatic fine tuning signal. Each source is an input to a mode control switch.

A television receiver is described in U.S. Pat. No. 4,641,190 wherein a blanking signal is generated when a channel change selection is made. The blanking signal is low pass filtered and thereafter controls the muting of the audio channel. Muting and unmuting are thus accomplished gradually, without audio disturbance. The tuning voltage is allowed to change to the new value required only after a delay period following the start of the blanking signal. Muting is therefore substantially complete before tuning transients can occur and cause audible noise.

Circuits are also known for detecting the status of a power supply in a receiver and executing a control sequence of commands responsive thereto. In a television receiver environment, for example, U.S. Pat. No. 4,641,064 describes a power supply which generates the normal operating level of an energizing voltage. An overload detector generates a first control signal to shut down the power supply and remove the energizing voltage when an overload condition occurs. A control circuit periodically samples the level of the energizing voltage. When the level is lower than normal, the control circuit generates a second control signal that maintains the power supply in the shut down mode so as to prevent the power supply from attempting to restart. A third control signal inhibits the generation of the second control signal when an input alternating current voltage that supplies the power to the power supply suffers a voltage drop or brown-out for only a short duration.

Similarly, run power supplies have been monitored as an indirect indicator of an overload condition, for example as described in the CTC 140 Color TV Chassis Technical Training Manual. An overvoltage X-ray protection circuit disables the run supply. Detecting the loss of run power results in the television receiver being turned off by the microprocessor.

Despite all of the developments in connection with synthesizing tuners, a vexing problem has persisted, and which until now has not been solved. Whenever the run power supply which powers the prescaler in the tuner circuit falls below a threshold value, the prescaler will operate abnormally and output a very high frequency signal. This signal is presented to the input of the phase locked loop tuning system, which develops an output indicative of an abrupt channel change to a lower frequency signal. The phase locked loop output to the integrator causes the tuning voltage to fall rapidly. The effect of this detuning causes the RF automatic gain control signal to increase, together with the tuner gain. The resulting abrupt detuning generates an undesirable and perceptibly loud sound. The increasing use of cable and satellite converter boxes, having AC outlets into which many receivers are plugged, significantly increases the incidence of AC power drop out behavior because power down control routines of the microprocessor are bypassed when the converter box is switched off.

The problem was not solved merely by detecting the loss of AC power and muting various parts of the audio circuit. The various amplifiers and circuits in the audio system have many capacitors, and respond with a relatively slow time constant. Even if one were to very promptly detect the loss of AC power and generate those signals necessary to mute every mutable element of the audio system, the muting would not take place quickly enough to suppress the noise generated by detuning of the phase locked loop responsive to the unexpected loss of AC power.

It is a characteristic of some receivers with standby and run power supplies that, when AC power is lost, run power supplies will drop before the standby power supplies are affected, for example by approximately 50 milliseconds to 100 milliseconds. This makes it possible to continue utilizing the microprocessor and the analog interface unit for generating additional control signals to suppress the audible noise resulting from abrupt detuning due to AC power interruption.

It is an aspect of this invention to suppress the generation and propagation of audible noise due to AC power interruption in a receiver having a tuner circuit and an audio circuit. The tuner circuit includes a local oscillator, a prescaler, a phase detector and an integrator interconnected for tuning the receiver to a given or selected channel by detecting a corresponding input signal. The tuner circuit has a tendency to uncontrollably detune during intermittent AC power interruption responsive to a spurious tuning control signal generated in the tuner circuit and generate audible noise during the detuning, the audible noise being reproduced together with the audible signal. In accordance with this aspect of the invention, the AC power source is closely monitored by a circuit which generates a control signal during conditions indicative of AC power interruption. A further circuit is provided responsive to the control signal for disabling normal operation of the tuner circuit, for example by disabling the tuner control circuit, and for disabling the audio circuit, thereby reducing the audible noise during AC power interruption.

In accordance with a further aspect of this invention, the further circuit disables normal operation of the tuner circuit prior to disabling the audio circuit. This eliminates the tuner as a source of audible noise as the audio circuit cannot be muted quickly enough to prevent propagation of that noise which is generated during detuning.

In accordance with yet another aspect of this invention, the tuner circuit is disabled by decoupling the output of the phase detector from the tuner control circuit.

In accordance with still another aspect of the invention, and more particularly, the further circuit disables normal operation of the tuner circuit by decoupling the output of the phase detector from the input to the integrator generating the tuning voltage, which in turn controls the local oscillator. The input to the integrator is permitted to float. Without any corrective input, the output of the integrator, and therefore the tuning voltage, will tend to remain the same. Although some random variation or floating of the tuning voltage is likely to occur, the frequency of the local oscillator will not change abruptly. Despite the floating and somewhat random variation, such minimal detuning as actually takes place is usually insufficient to generate any appreciable quantity of noise. This approach is particularly effective because it addresses the very source of the problem, namely the spurious output signal generated by improper operation of the prescaler when the run power supply drops out. The muting which occurs from disabling the audio circuit is at least effective to reduce noise generated by the power supplies themselves falling out. It is not possible to eliminate such fall out noise entirely, but it is possible to reduce the level of noise so as to be unobjectionable under most circumstances.

In accordance with yet another aspect of this invention, a circuit for detecting AC power interruption may comprise a circuit for comparing a first voltage level generated by at least one run power supply with a predetermined voltage level. In one embodiment, the predetermined voltage level may correspond to a second voltage level generated by the standby power supply. In another embodiment, the predetermined voltage level may correspond to a second voltage level generated by the at least one run power supply in an energy storage device, such as a capacitor. In either embodiment, the circuit may comprise a transistor, the control signal being generated by switching of the transistor.

In accordance with yet another aspect of the invention, the control signal from the AC power interruption detection circuit may be applied as an input to a microprocessor powered by the standby power supply. The microprocessor may comprise means for generating a first command or control signal, for example a PLL control signal, to disable the tuner control circuit and a second command or control signal, for example a MUTE control signal, to disable the audio circuit. The audio circuit may comprise first and second sets of amplifiers, in which case the microprocessor may comprise means for generating a first or command PLL command signal to disable the tuner control circuit, a second or VOLUME command signal for quieting the first set of amplifiers and a third command or control signal, for example a MUTE control signal, to disable the second set of amplifiers. It is preferable that the microprocessor disable normal operation of the tuner circuit prior to disabling the audio circuit, in order to prevent the generation of noise from abrupt detuning in the first instance. The microprocessor may disable normal operation of the tuner circuit by generating a command effective to decouple the output of the phase locked loop from the input to the integrator.

The invention is described in connection with the accompanying drawings, wherein.

Figure 1:
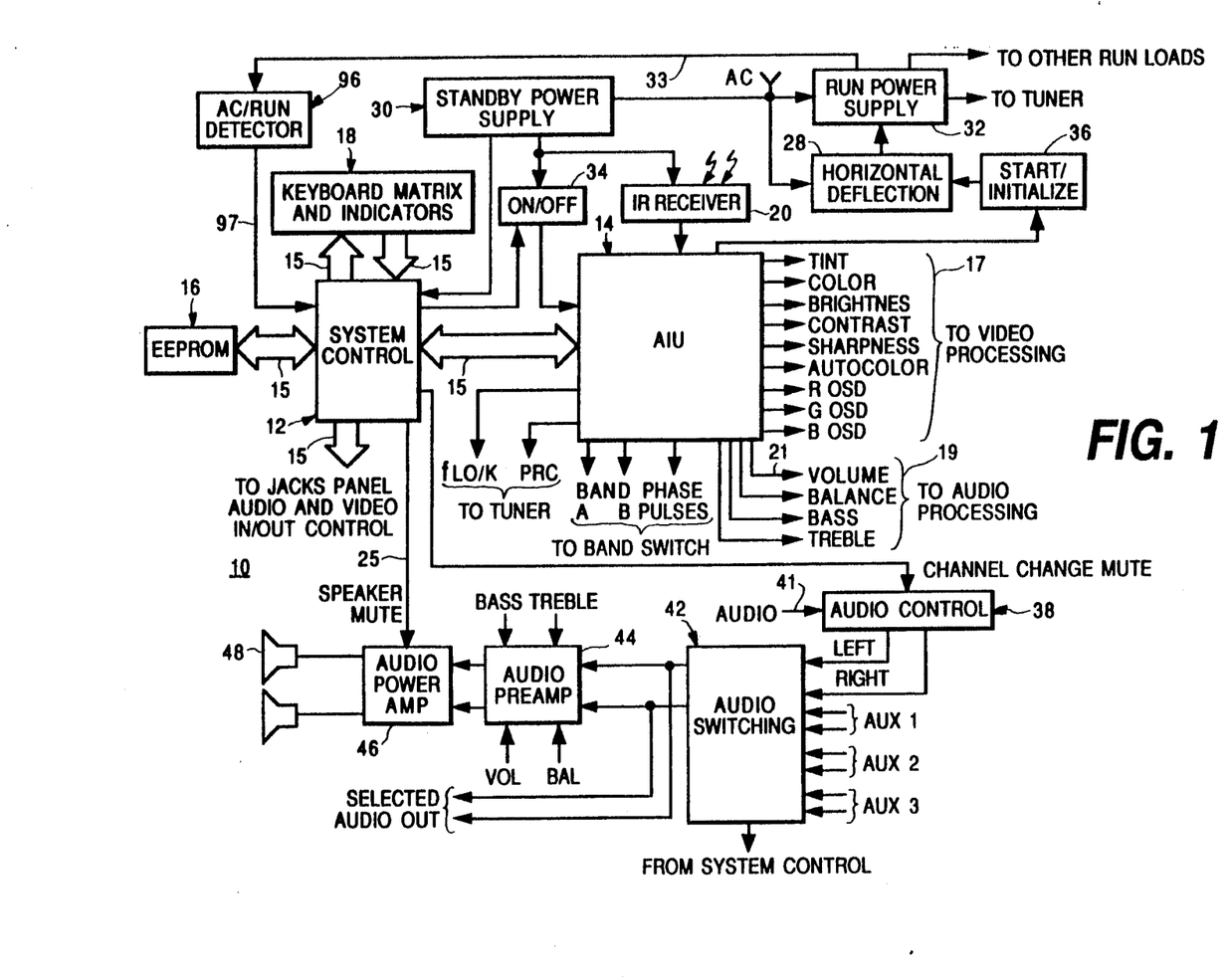
FIG. 1 is a block diagram of a television receiver in accordance with this invention.

A television receiver incorporating the invention is shown in block diagram form in FIG. 1 and designated generally by reference numeral 10. The receiver 10 is provided with a digital control system. The digital control system comprises a system control microprocessor 12, an analog interface unit AIU 14, an electronically erasable and programmable memory EEPROM 16, a keyboard matrix and indicator unit 18 and an infrared receiver 20.

Figure 2:
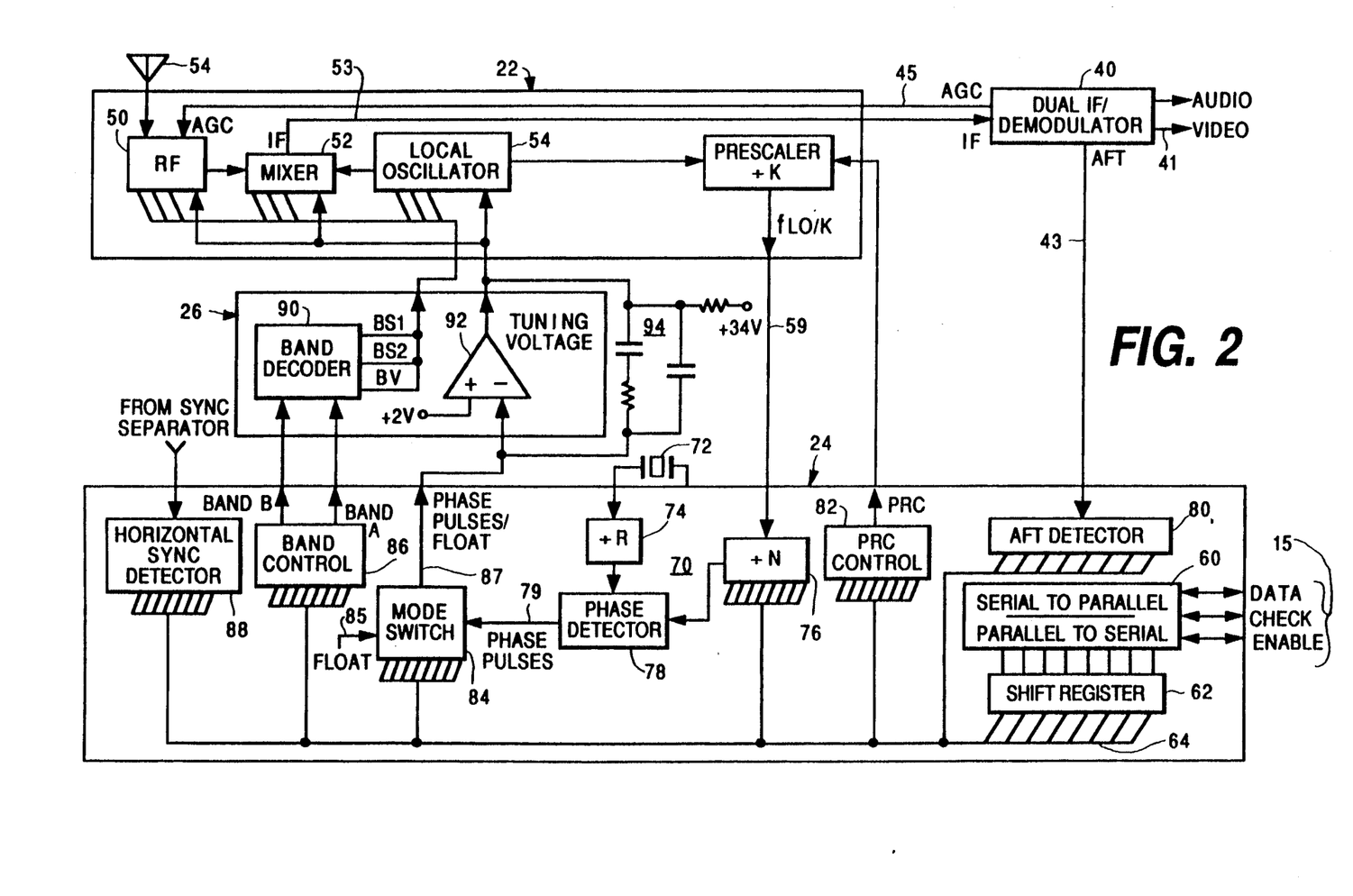
FIG. 2 is a block diagram of a tuner and tuner control circuit for the receiver shown in FIG. 1.

The tuner circuit is shown in more detail in FIG. 2 and generally includes a tuner 22, a tuner control circuit 24 and a band switch 26. The tuner control circuit 24 is part of the analog interface unit 14. It will be appreciated that the division between the tuner and the tuner control circuit is to some extent a matter of definition.

The various parts of the digital control system communicate with one another and with remote circuits over a single serial data bus 15, illustrated schematically as a number of separate branches. The output of infrared receiver 20 for the remote control unit is monitored as an input to analog interface unit 14. The serial data bus is typically three lines, designated DATA, CLOCK and ENABLE, as shown in FIG. 2.

The system control microprocessor 12 scans the front panel keys of the keyboard matrix 18 and monitors for a keypress. When a keypress is detected, the microprocessor determines which key has been pressed and initiates an appropriate program sequence Scanning of the front panel keys or buttons is also used to drive the front panel indicators.

A crystal oscillator 72, for example 4 MHz, as shown in FIG. 2, is used to generate a clock for timing the analog interface unit and the microprocessor However, the serial data bus may run at a lower frequency, for example 125 kH. This is generated by the microprocessor 12 dividing down the 4 MHz clock signal The EEPROM 14 stores information for operating and tuning the receiver.

An AC power source is used to energize at least one standby DC power supply 30, and indirectly, to energize at least one run DC power supply 32. The run power supply 32 may be energized by operation of a horizontal deflection circuit 28, through a flyback transformer. The details of such horizontal deflection circuits are well known, and are omitted from the drawing. The analog interface unit 14 provides power on/off control to the run power supply 32, digital control of picture and audio circuits, on-screen display control and tuning control. The microprocessor receives standby power, even when the receiver is turned off. The analog interface unit may receive switched standby power from an on/off switch 34, which monitors the output voltage levels, for example +5V DC and +12V DC, of the standby power supply 30.

The analog interface unit 14 may control the video and audio using a method referred to as quasi digital control. The adjustments are so designated because the actual adjustment is performed by varying digital pulses that are then integrated or filtered to generate analog control voltages.

Under normal circumstances, the system control 12 recognizes a signal from the keyboard or infrared receiver to turn on the receiver. A control signal is generated through the analog interface unit 14 to the start-/initialize circuitry 36. This starts a process which includes energizing the horizontal deflection circuit 28. One or more secondary windings of the flyback transformer in the horizontal deflection circuit may be used as a source of run power supply voltage, being energized by the trace or retrace voltages magnetically coupled through the flyback transformer. During operation, the analog interface unit continually adjusts, as necessary, a plurality of signals 17 for controlling video processing and a plurality of signals 19 for controlling audio processing. Of these sets of signals, the volume control signal on line 21 may be utilized directly in the invention.

The audio control circuit 38 receives a demodulated IF audio signal from a dual IF/demodulator 40 on line 41, and derives therefrom left and right channel audio signals. An audio switching circuit 42 is controlled by the system control and an audio preamplifier 44 is controlled by the analog interface unit. The left and right channels are coupled from the audio switching circuit 42 to the audio preamplifier circuit 44, and from there to the audio power output amplifier 46. The audio signals may also be output to an external amplifier or recorder. Moreover, auxiliary audio inputs may also be accommodated. A SPEAKER MUTE control is generated by the system control for muting the audio power output amplifier 46, over control line 25. The audio power output amplifier 46 drives speakers 48. In a television receiver equipped for stereo sound, each of the sound channels will typically represent a 5 watt dynamic audio load. An interruption of AC power also adversely affects the audio preamplifier and audio output amplifier, both of which will become a source of random noise as the power supplies drop out. However, as noted, the amplifier circuits are such that sound will continue to be transmitted by the loudspeakers as the run power supply falls out, and for some period of time thereafter. This continuing operation enables noise signals generated elsewhere in the receiver to be propagated through and transmitted acoustically. The circuits are also such as to have large time constants associated with a control circuit responsive to the volume and speaker mute control signals.

Synthesizing tuners are frequently embodied as varactor tuning systems, which utilize varactor diodes Varactor diodes are semiconductors that act as variable capacitors when the voltage across them is varied. This characteristic can be used in tuned circuits to vary the tuning. A typical varactor tuning system 22, as shown in FIG. 2, has three stages that must be tuned. These are the radio frequency RF stage 50, the mixer stage 52 and a voltage controlled local oscillator stage 54. An antenna 56, or a cable box, not shown, may provide an input signal for the RF stage. The output of the mixer stage 52 is an intermediate frequency IF signal on line 53 to the dual IF demodulator 40. Tuning is accomplished by varying the tuning voltage and the voltage of the band switch control signals BAND A and BAND B, which are supplied by the tuner control circuit, described hereinafter, in accordance with tuning algorithms executed by the system control microprocessor. The voltage levels of the BAND A and BAND B signals are decoded by band decoder 90 into control signals BS1, BS2 and BV, which are inputs to each of the RF, mixer and local oscillator stages for selecting each tuning band.

The dual intermediate frequency IF/demodulator section 40 generates an auto fine tune AFT signal on line 43 that is monitored by the system control circuit to ensure that the proper tuning voltage is maintained. Another tuner control voltage generated by the IF section is the RF automatic gain control AGC. The AGC signal is applied to the tuner RF stage on line 45 to control the RF amplifier gain so that the input to the IF section remains at about the same amplitude.

The microprocessor 12 communicates with the tuner control circuit 24 over serial data bus 15. The data bus is connected to a serial to parallel and parallel to serial converter 60. Incoming data or commands from the microprocessor are converted from serial to parallel format. Data monitored by the microprocessor is converted from parallel to serial format. The converter 60 is connected to a shift register 62, for example an eight bit shift register. The shift register 62 forms a data buffer between the converter 60 and a parallel data bus 64. Parallel data bus 64 is routed to each constituent circuit of the tuner control circuit 24 which is controlled or monitored by the microprocessor. All eight bits may not be necessary for communicating with each constituent circuit, notwithstanding the general and schematic representation.

The constituent circuits of the tuner control circuit 24 include a phase locked loop 70, an automatic fine tune AFT signal detector 80, a pulse removing circuit PRC control 82, a mode switch 84, a band control 86 and a horizontal synchronizing pulse detector 88. The phase locked loop 70 includes crystal oscillator 72, a divide by R circuit 74, a programmable divide by N circuit 76, and a phase detector 78. Such a tuner control circuit has been embodied as part of an integrated circuit, identified by RCA (Thomson Consumer Electronics) part no. 1421874-002.

The band switch 26 provides an intermediate processing stage between the tuner control circuit 24 and the local oscillator 54. In a varactor tuning system, the tuning voltage and band control voltages are usually also applied to the RF stage 50 and the mixer stage 52. The band switch 26 includes band decoder 90 and amplifier 92. Amplifier 92 is configured as an integrating operational amplifier by resistor/capacitor network 94. The output of integrating amplifier 92 is a tuning voltage also applied to each of the RF, mixer and local oscillator stages.

During normal operation, a sample of the tuner local oscillator signal is supplied to the tuner prescaler 56. The prescaler is a divider that generates a divided down local oscillator signal. Dividing down the local oscillator signal produces a low frequency sample and permits the use of a low frequency reference, or comparison signal, which is generally easier to generate and control than a high frequency reference signal. The prescaler 56 incorporates a pulse removing circuit The pulse removing circuit adjusts the signal in accordance with band selection, for example, UHF, VHF or cable. The adjustment is effected by the PRC control circuit 82, under control of the microprocessor through parallel data bus 64 and serial data bus 15. The output signal from the prescaler 56 is the frequency of the local oscillator divided by the factor K, designated fLO/K, on line 59. The fLO/K signal is applied as an input to the programmable divide by N circuit 76, which is also controlled by the microprocessor through the parallel and serial data buses.

The output of the crystal oscillator 72 is reduced in frequency by the divide by R circuit 74. This internal frequency is compared in phase detector 78 to the output of the divide by N circuit 76. Phase pulses are produced on line 59 by comparing the sample of the tuner local oscillator signal, after processing by the prescaler and divide by N circuits, to the internal reference frequency. The number of phase pulses is directly proportional to how far the local oscillator signal is off frequency. The greater the frequency error, the higher the number of phase pulses produced. Alternatively, the frequency of the output pulses may remain constant while variations in pulse width are indicative of frequency error. Phase pulse polarity is determined by the direction of the frequency error. When the local oscillator frequency is high, the polarity is positive. A low frequency produces negative phase pulses.

Varying the number and polarity of phase pulses adjusts the tuning. The varactor diodes, controlled by the tuning voltages, are used to vary the resonant frequencies of the tuning circuits in the RF amplifier, mixer and local oscillator. In order to cover the complete broadcast and cable television frequency spectrum, for example, the tuning voltage will vary between 0.5 volts and 30 volts.

The output of phase detector 78, in the form of phase pulses indicative of errors in tuning frequency, is one input to mode switch 84. Another input to mode switch 84 is designated FLOAT, and is associated with line 85. Line 85 is in fact an unused input, which in prior tuning systems, was sometimes coupled to the AFT signal output from the IF demodulator. If a mode switch was not available as part of a commercially available integrated circuit, such as identified above, a discrete mode switch may be interposed between the output of the phase locked loop and the input to the integrator. Such a mode switch must also be coupled to the microprocessor, by a direct output or by the serial data bus. The mode switch 84 will couple either one of the inputs from lines 79 and 85 to output line 87, which is an input line to integrator 92. It will be appreciated that the output of integrator 92 will be a voltage level related to the number of phase pulses and the polarity of phase pulses on line 87. The mode switch 84 is controlled by the microprocessor During all normal operation of the receiver, the mode switch is set to enable normal operation of the tuner control circuit 24, by feeding the phase pulses produced by the phase locked loop 70 to the input of integrator 92, so that the appropriate tuning voltage can be developed for controlling local oscillator 54.

Once the phase locked loop has locked onto a desired frequency, the microprocessor monitors for the presence of horizontal synchronizing pulses by reading the contents of horizontal sync detector 88 and monitors the correctness of the tuning frequency by reading the condition of the AFT detector 80. Monitoring for horizontal sync pulses and the condition of the AFT signal are necessary because of frequency effects of the RF carrier produced by cable systems, video recorders, video game apparatus, computers and the like. All of these are likely to generate carrier frequencies which deviate from the corresponding broadcast carrier frequency. The microprocessor executes tuning algorithms which change the division ratio of the divide by N circuit 76.

When AC power is interrupted, the tuner and tuner control circuit are unable to maintain the channel selection. More particularly, whenever the run power supply which powers the prescaler 56 in the tuner circuit 22 falls below a threshold value, the prescaler will operate abnormally and output a very high frequency signal. This signal is presented to the input of the phase locked loop 70. Phase locked loop 70 develops an output indicative of an abrupt channel change to a lower frequency signal. The phase locked loop output to the integrator therefore causes the tuning voltage generated by the integrator to fall rapidly. The effect of this rapid detuning causes the RF automatic gain control signal to increase, together with the tuner gain. The resulting abrupt detuning generates an undesirable and perceptibly loud sound.

In order to prevent such loud sounds from occurring during AC power interruption, it is necessary to disable normal operation of the tuner circuit. This may be accomplished by disabling the tuner control circuit in such a fashion as to prevent an abrupt change in the tuning voltage, not withstanding the excessive number of phase pulses produced by the phase locked loop responsive to the abnormal output of the prescaler. In other words, the normal control loop for the tuner circuit must be disabled.

The control loop can be disabled in accordance with an aspect of this invention by decoupling the output of the phase locked loop so that the phase pulses, in excessive number, are effectively ignored. This may be accomplished by mode switch 84. If mode switch 84 is directed to couple the floating input 85 to output line 87, instead of input line 79, no pulses positive or negative will appear at the input to integrator 92. In the absence of any change at the input of the integrator, the output of integrator 92, namely the tuning voltage, will remain reasonably constant. Inasmuch as input line 85 is floating, some variation of the voltage at the input to the integrator may occur. However, such variations as occur can be expected to be of insufficient magnitude to cause the abrupt detuning and subsequent noise generation that would be expected from the normal operating response of the tuner control circuit during AC power interruption. The mode switch 84 may be controlled responsive to commands generated by the microprocessor as the mode switch 84 is on the parallel data bus 64, and is therefore in communication with the microprocessor over the serial data bus 15.

In order for normal operation of the tuner and tuner control circuit to be disabled, the interruption of AC power must be detected AC power interruption may be sensed by AC/RUN detector circuit 96, which generates a control signal to the system control on line 97. With further reference to the upper part of FIG. 1, the AC power source is coupled to standby power supply 30 and, through the horizontal deflection circuit, to run power supply 32. Run power supply 32 supplies run voltage to the tuner, and other loads. The output voltage of the run power supply is monitored on line 33, which is an input to the AC/RUN detector 96.

Figure 3:
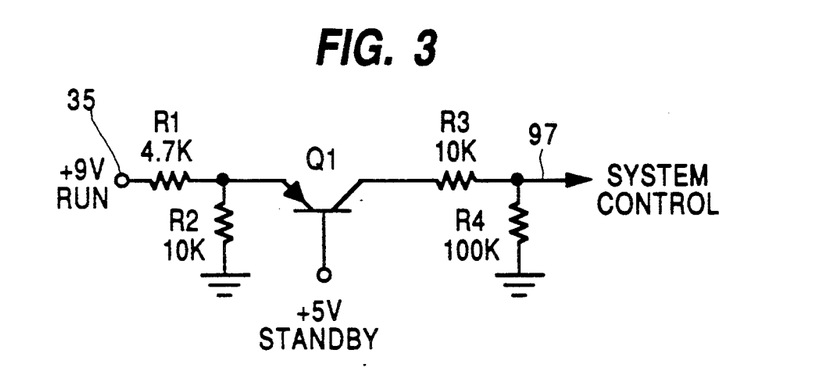
FIG. 3 is a circuit schematic for a first AC power interruption detector.
Figure 4:
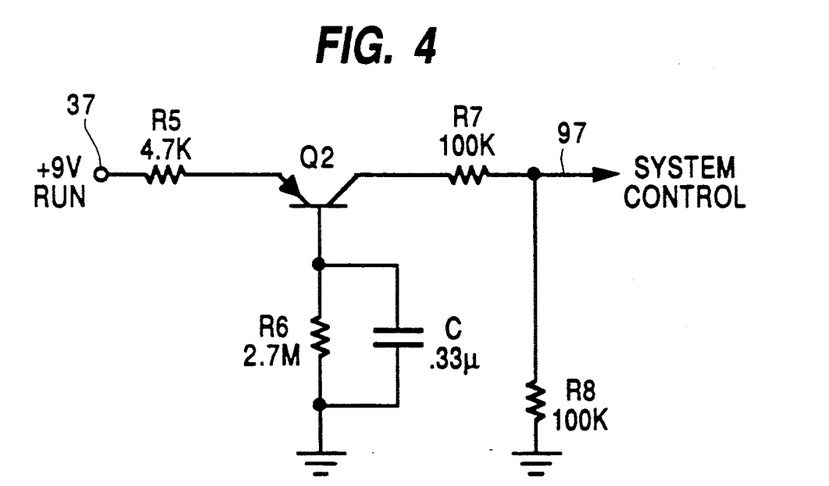
FIG. 4 is a circuit schematic for a second AC power interruption detector.

Suitable AC/RUN detectors are shown in FIGS. 3 and 4. The AC/RUN detector circuit shown in FIG. 3 takes advantage of the fact that the run supply tends to drop 50 to 100 milliseconds before the standby power supply drops.

A run power supply voltage, for example +9 volts, is coupled by line 33 to input terminal 35. A voltage divider is formed by resistors R1 and R2, such that during operation of the run supply, the voltage at the emitter electrode of transistor Q1 is approximately 6 volts. Inasmuch as the base electrode of transistor Q1 is coupled to the run standby voltage, for example +5 volts, the emitter base junction of transistor Q1 is forward biased and transistor Q1 remains turned on during normal operation. This is a logical Hi on output line 97, which is transmitted to the system control, and indicates that the AC power is being supplied. Should AC power be interrupted, the run power supply will begin falling rapidly. When the run supply voltage falls to approximately 8 volts, the voltage at the emitter electrode of transistor Q1 will be low enough to reverse bias the emitter base junction and switch transistor Q1 to a nonconductive state. This will result in a logical Lo signal on output line 97, which will be interpreted by the system control as an indication that AC power has been interrupted. Alternatively, the system control may be responsive to the Hi to Lo transition, rather than the Lo level.

The circuit shown in FIG. 4 compares the run voltage at input terminal 37 to a reference voltage developed across a capacitor C biased by the run supply itself, rather than to the level of standby voltage. The time constant of the network formed by resistor R6 and capacitor C must be greater than the time constant of the +9 volt run supply. A slight drop in the +9 volt run supply will reverse bias the emitter base junction of transistor Q2 and switch transistor Q2 from a conductive to a non-conductive state. This also results in a logical Lo signal, with a negative transition, being transmitted to the system control on line 97.

The circuit shown in FIG. 4 is advantageous with respect to that shown in FIG. 3, insofar as power supply and resistor tolerances are not factors for reliable operation, and power loss detection is very rapid. The circuit of FIG. 3 is advantageous with respect to the circuit in FIG. 4, in that a well regulated +9 volt run supply is not required, so that false detection is not likely to occur.

During normal operation of the receiver, the AC/RUN detector 96 will transmit a logical Hi signal to the system control, and the tuner circuit will operate normally as described above. In the event of AC power interruption, either from the receiver being unplugged or from a reduced power condition, the AC/RUN detector 96 will generate a control signal on line 97, which will be interpreted by the system control as an indication that AC power has been interrupted. The system control 12 will firstly send a control signal to the analog interface unit 14 to disable normal operation of the tuner control circuit by operating mode switch 84 to decouple the output of the phase locked loop 70 from the input to the integrator 92. Thereafter, the system control will initiate a VOLUME MUTE through the analog interface unit over line 21 and will activate a SPEAKER MUTE control signal directly, over line 25. Under these circumstances, a significant source of noise in the tuner circuit will be eliminated from its inception. The amplifiers in the audio circuit will be muted to reduce the propagation of additional noise resulting from the run power supplies falling out. The audible noise resulting from AC power interruption is thereby substantially perceptibly reduced.

What is claimed is:

1. A receiver, comprising:
   at least one run power supply;
   an auxiliary power source for generating power for a certain period of time during AC power interruption;
   a tuner circuit energized by the at least one run power supply, and having a local oscillator, a prescaler, a phase detector and an integrator interconnected in a phase locked control loop for tuning the receiver to a given channel by detecting a corresponding input signal, a spurious tuning control signal being generated in the control loop during AC power interruption;
   an audio circuit energized by at least one run power supply, for reproducing an audio component in the input signal;
   means for detecting an intermittent AC power interruption and generating a power loss control sign; and,
   means energized by the auxiliary power supply and responsive to the power loss control signal when the intermittent AC power interruption is detected, for disabling the tuner circuit to prevent abrupt detuning responsive to the spurious tuning control signal and for disabling the audio circuit.

2. A receiver, comprising:
   a first power source operable during application of AC power to the receiver;
   a second power source for generating power for a certain period of time during AC power interruption;
   a tuner circuit, energized by the first power source, and having a local oscillator, a prescaler, a phase detector and an integrator interconnected in a phase locked control loop for tuning to a given channel to detect a corresponding input signal, a spurious tuning control signal being generated in the control loop during an intermittent AC power interruption;
   an audio circuit, energized by the first power source, for reproducing an audio component in the given signal;
   means for detecting an AC power interruption and generating a power loss control signal; and,
   means energized by the second power source and responsive to the power loss control signal when the intermittent AC power interruption is detected, for disabling normal operation of the tuner circuit to inhibit generation of audible noise otherwise resulting from an abrupt detuning due to the spurious tuning control signal and for disabling the audio circuit.

3. The receiver of claim 2, wherein the means responsive to the power loss control signal disables the normal operation of the tuner circuit prior to disabling the audio circuit to inhibit generation of detuning noise which would otherwise tend to propagate through the audio circuit notwithstanding the disabling of the audio circuit, and thereafter, to inhibit propagation of other noise through the audio circuit.

4. The receiver of claim 2, wherein the control loop of the tuner circuit is opened responsive to the power loss control signal prior t the disabling of the audio circuit to inhibit generation of detuning noise which would otherwise tend to propagate through the audio circuit notwithstanding the disabling of the audio circuit, and thereafter, to inhibit propagation of other noise through the audio circuit.

5. The receiver of claim 4 wherein the means responsive to the power loss control signal opens the control loop by decoupling the phase detector from the integrator.

6. The receiver of claim 2, wherein the means for detecting the AC power interruption comprises means for comparing a first voltage level derived from the first power source with a predetermined voltage level.

7. The receiver of claim 6, wherein the predetermined voltage level corresponds to a second voltage level derived from the second power source.

8. The receiver of claim 6, wherein the predetermined voltage level corresponds to a second voltage level derived from the first power source in an energy storage device.

9. The receiver of claim 6, wherein the means for detecting the AC power interruption comprises a switch means coupled between the comparing means and the means responsive to the power loss control signal, the power loss control signal being generated by operation of the switch means.

10. The receiver of claim 2, wherein the means responsive to the power loss control signal comprises a microprocessor for disabling the normal operation of the tuner circuit prior to disabling the audio circuit to inhibit generation of detuning noise which wold otherwise tend to propagate through the audio circuit notwithstanding the disabling of the audio circuit, and thereafter, to inhibit propagation of other noise through the audio circuit.

11. A receiver, comprising:
at least one run power supply;
a standby power supply energized by an AC power source, the standby power supply generating standby power for a certain period of time during AC power interruption;
a tuner circuit, energized by the at least one run power supply, and having a local oscillator, a prescaler, a phase detector and an integrator interconnected in a phase locked control loop for tuning the receiver to a selected channel by detecting a corresponding input signal, a spurious tuning control signal being generated in the control loop during AC power interruption;
an audio circuit, energized by the at least one run power supply, for reproducing an audio component in the input signal;
means for detecting an intermittent AC power interruption and generating a power loss control signal; and,
a microprocessor, energized by the standby power supply and responsive to the power loss control signal when the intermittent AC power interruption is detected, for generating a first command signal to disable normal operation of the tuner circuit to prevent abrupt detuning responsive to the spurious tuning control signal and a second command signal to disable the audio circuit.

12. The receiver of claim 11 wherein the microprocessor disables normal operation of the tuner circuit prior to disabling the audio circuit.

13. The receiver of claim 12, wherein the microprocessor disables normal operation of the tuner circuit by preventing propagation of the spurious tuning control signal.

14. The receiver of claim 12 wherein the microprocessor disables normal operation of the tuner circuit by decoupling the phase detector from the integrator to prevent propagation of the spurious tuning control signal.

15. The receiver of claim 11, wherein the means for detecting AC power interruption comprises mean for comparing a first voltage level derived from the at least one run power supply with a predetermined voltage level.

16. The receiver of claim 15, wherein the predetermined voltage level corresponds to a second voltage level derived from the standby power supply.

17. The receiver of claim 15, wherein the predetermined voltage level corresponds to a second voltage level derived from the at least one run power supply in an energy storage device.

18. A television receiver, comprising:
a horizontal deflection circuit, including a flyback transformer energized from an AC power source during operation of the television receiver and having at least one secondary winding for developing at least one run power supply;
a standby power supply, continuously energized when the receiver is coupled to the AC power source and generating standby power for a certain period of time during AC power interruption;
a tuner circuit, energized by the run power supply and having a local oscillator, a prescaler, a phase detector and an integrator interconnected for tuning the receiver to a selected channel by detecting a selected a corresponding input signal;
an audio circuit, energized by the run power supply and having an amplifier for reproducing an audio component in the detected signal;
means for detecting an intermittent AC power interruption by monitoring a first voltage level derived from the at least one run power supply and generating a power loss control signal;
a microprocessor for controlling video and audio processing, energized by the standby power supply, and responsive to the power loss control signal when AC power is interrupted absent a user command for generating a first command signal to disable normal operation of the tuner and a second command to mute the amplifier.

19. The receiver of claim 18, wherein the means for detecting the AC power interruption comprises means for comparing the first voltage level with a predetermined voltage level.

20. The receiver of claim 19, wherein the predetermined voltage level corresponds to a second voltage level derived from the standby power supply.

21. The receiver of claim 19, wherein the predetermined voltage level corresponds to a second voltage level derived from the at least one run power supply in an energy storage device.

22. A receiver, comprising:
a tuner circuit for tuning to a given channel to detect a given input signal, a constituent circuit part of the tuner circuit being prone to generate a spurious tuning control signal during an AC power interruption, while the tuner circuit otherwise tends to maintain normal operation for a period of time and produce a corresponding detuning noise;
an audio circuit for reproducing an audio component in the given signal, the audio circuit also tending to remain operational for a period of time notwithstanding the AC power interruption and propagate said detuning noise and other noise;
means for detecting an AC power interruption and generating a power loss control signal; and,
means responsive to the power loss control signal for disabling the normal operation of the tuner circuit, and thereafter, disabling the audio circuit, to inhibit generation of the detuning noise which would otherwise tend to propagate through the audio circuit notwithstanding the disabling of the audio circuit and to inhibit the propagation of the other noise through the audio circuit.

23. The receiver of claim 22, further comprising:
at least one run power supply, energized by an AC power source, for powering the tuner circuit and the audio circuit; and,
a standby power supply, energized by the AC power source, for powering the means responsive to the power loss control signal, the standby power supply generating standby power for a certain period of time after AC power interruption.

24. The receiver of claim 22, wherein the tuner circuit comprises having a local oscillator, a prescaler, a phase detector and an integrator interconnected as a phase locked loop for detecting the selected input signal, the phase detector being decoupled from the integrator responsive to the power loss control signal.

25. The receiver of claim 22, wherein the means for detecting the AC power interruption comprises means for comparing a first voltage level derived from the at least one run power supply with a predetermined voltage level.

* * * * *